(12) United States Patent
Logan et al.

(10) Patent No.: US 7,514,013 B2
(45) Date of Patent: Apr. 7, 2009

(54) DEVICES WITH THERMOELECTRIC AND THERMODIODIC CHARACTERISTICS AND METHODS FOR MANUFACTURING SAME

(76) Inventors: Mark Logan, 253 Rombout Rd., Pleasant Valley, NY (US) 12569-7850; Frederick A. Flitsch, 25 Twin Ponds Rd., New Windsor, NY (US) 12553; Lloyd Wright, 16 Fairview Rd., Hopewell Junction, NY (US) 12533-6819; Lloyd Young, 8 Brenner Ridge Rd., Pleasant Valley, NY (US) 12569

( * ) Notice: Subject to any disclaimer, the term of this patent is extended or adjusted under 35 U.S.C. 154(b) by 0 days.

(21) Appl. No.: 11/519,180

(22) Filed: Sep. 11, 2006

(65) Prior Publication Data

US 2007/0193616 A1    Aug. 23, 2007

Related U.S. Application Data

(60) Provisional application No. 60/716,070, filed on Sep. 12, 2005.

(51) Int. Cl.
*B44C 1/22* (2006.01)
*H01L 21/302* (2006.01)

(52) U.S. Cl. .......... 216/11; 216/13; 216/37; 216/75; 216/100; 438/694

(58) Field of Classification Search .......... 216/11, 216/13, 37, 75, 100; 438/694
See application file for complete search history.

(56) References Cited

U.S. PATENT DOCUMENTS

| | | | |
|---|---|---|---|
| 6,589,629 B1 * | 7/2003 | Bao et al. | 428/144 |
| 7,292,334 B1 * | 11/2007 | Bratkovski et al. | 356/301 |
| 2001/0033135 A1 * | 10/2001 | Duggal et al. | 313/506 |
| 2005/0064204 A1 * | 3/2005 | Lalli et al. | 428/428 |
| 2005/0150538 A1 * | 7/2005 | Liu et al. | 136/205 |
| 2006/0261719 A1 * | 11/2006 | Fox | 313/311 |

* cited by examiner

Primary Examiner—Binh X Tran

(57) ABSTRACT

The present invention relates to methods for forming thermoelectric and thermodiodic devices including a monolayer of multiple conductive material units with a first surface including a composite of multiple conductive units in electrical contact with a conductive substrate; a second surface with a composite of multiple conductive units; an ioni conductor; and a second surface. A resulting device can include a semiconductor device.

20 Claims, 4 Drawing Sheets

PRIOR ART

DEVICES WITH THERMOELECTRIC AND THERMODIODIC CHARACTERISTICS AND METHODS FOR MANUFACTURING SAME

CROSS REFERENCE TO RELATED APPLICATIONS

This application claims priority to the Provisional Application, Ser. No. 60/716,070, filed Sep. 12, 2005 and entitled: "Devices with Thermoelectric and Thermodiodic Characteristics and Methods for Manufacturing Same". The contents of each are relied upon and incorporated herein by reference.

FIELD OF THE INVENTION

This invention relates generally to devices with thermoelectric and thermodiodic characteristics. In particular the present invention relates to high efficiency thermoelectric devices and methods and systems for manufacturing the same.

BACKGROUND

Thermocouples operating in accordance with the Peltier effect are well known in the arts. Applications for thermoelectric devices include heating, power generation and temperature sensing. However, the efficiency of previously known thermoelectric devices limited their usefulness.

As discovered by Peltier in 1835, arranging two dissimilar conductors next to each other and applying a voltage differential across the conductors can create a thermo electric device. More recently, thermoelectric devices have been formed with two dissimilar semiconductors, such as bismuth telluride ($Bi_2Te_3$) doped with selenium and antimony (Bi, Sb)$_2$ Te$_3$ & $Bi_2(Te,Se)_3$ to form n-type and p-type materials. Other materials can include PbTe and SiGe. With a voltage applied across the two types of materials, the electrons in each material have a different potential energy. Therefore to move from one type of material to another type of material, the electrons must either absorb energy or release it, depending upon which direction they travel. The result is heat being absorbed on one side of the device and heat being released on the other, such as, for example, in the prior art device illustrated in FIG. 4.

FIG. 4 illustrates a cut away perspective drawing showing P-type 407 and N-type blocks 406 of material. As illustrated, like type blocks 406 or 407 are conductively connected via plates 403-405 and bordered by a packaging layer 408. Electrically conductive terminals 401 and 402 can extend beyond the package 408 for connection to a power source (not shown).

The efficiency of a thermoelectric device is generally limited to its associated Carnot cycle efficiency reduced by a factor which is dependent upon the thermoelectric figure of merit of materials used in fabrication of the associated thermoelectric elements, ZT, where $Z=\alpha^2/\rho\lambda$ with $\alpha$=the Seebeck coefficient (the change in voltage with temperature dV/dT), $\rho$=the electrical resistivity, and $\lambda$=the thermal conductivity. As can be seen from the definition of Z, the efficiency of a thermoelectric device decreases with increasing thermal conductivity or electrical resistivity. Improving the efficiency of thermoelectric devices requires either increasing the Seebeck coefficient or reducing the thermal conductivity or electrical resistivity.

It is known in the art to manufacture a thermoelectric device by extruding a billet of P-type material to form a P-type extrusion, also extruding a billet of N-type material to form an N-type extrusion. The P and N-type extrusions are sliced into wafers, the wafers are sliced into small elements, and the elements are mechanically loaded into a matrix of a desired pattern and assembled upon an electrically insulating plate with small copper pads connecting all of the elements electrically in series and thermally in parallel on the plate.

The prior art also includes methods of forming a thermoelectric material by combining a P-type extrusion with a N-type extrusion to form a P/N-type billet. The P/N-type billet may be extruded to form a P/N-type extrusion having P-type regions, and N-type regions. According to this method, the number of P-type regions and N-type regions correspond with the number of P-type extrusions and N-type extrusions used to form the P/N-type billet.

In some prior art embodiments, a thermoelectric module includes two ceramic substrate plates that serve as a foundation and also as electrical insulation for P-type and N-type Bismuth Telluride blocks. A pattern of blocks is laid out on the ceramic substrates so that they are electrically connected in series configuration. The position of the blocks between the two ceramic substrates provides a parallel configuration for the thermal characteristics of the blocks. The ceramic plates also serve as insulation between a) the blocks internal electrical elements and a heat sink that will typically be placed in contact with the hot side and b) the blocks internal electrical elements and whatever may be in contact with the cold side surface.

Typical commercially available modules have an even number of P-type and N-type blocks. The blocks are arranged so that one of each type of block shares an electrical interconnection often referred to as a "couple."

As discussed above, it is known for P-type to be fashioned from an alloy of Bismuth and the N-type to be fashioned from an alloy of Tellurium. Both Bismuth and Tellurium have different free electron densities at the same temperature. P-type blocks are composed of material having a deficiency of electrons while N-type has an excess of electrons. As current flows through the module (up and down through the blocks) the amperage attempts to establish equilibrium throughout the module. The current causes the P-type material to become analogous to a hot area that will be cooled and the N-type to become analogous to a cool area that will be heated. Since both materials are actually at the same temperature, the result of the applied current is that the hot side of the module is heated and the cold side of the module is cooled. Since direct current is applied, the direction of the current can be used to determine whether a particular side of the module will be cooled or heated. Simple reversal of the DC polarity will switch the hot and cold sides.

However, the efficiency of the prior art hinder many applications. Much materials research has been conducted in an effort to find bulk materials with a higher figure of merit than Bismuth-Telluride, to no avail. As a result, recent efforts have focused on optimizing the thermoelectric device construction, rather than the basic materials. Unfortunately, each of the published methods have significant limitations, for example:

1) Superlattice Structures: The method reduces thermal conductivity in thermoelectric devices via blocking phonon conduction by constructing electron energy level barriers and requires an array of hundreds of precisely deposited thin layers of BiTe doped at slightly different levels. The transistion in doping levels between layers must be very sharp, making fabrication of such devices very expensive and also very sensitive to diffusion of dopants, leading to reliability problems.

2) Thermionic Emission devices: These devices cool via emission of electrons at a relatively higher energy level from one surface to another surface at very close proximity whose electrons are at a slightly lower energy level. This method requires the two surfaces be maintained approximately 10 nm apart using piezoelectric devices. It also requires the use of exotic materials such as cesium. They are very expensive to manufacture and unreliable due to the difficulty in maintaining a uniform 10 nm gap within the device.

3) Lateral thin film devices: These devices have thin film channels of BiTe deposited laterally on the surface of wafers (increasing the thermal conduction path length) and then rely upon heat transfer pads to conduct heat vertically through the device to the object being cooled in an effort to focus the conduction of heat in high-conductivity channels while limiting the parasitic losses elsewhere. These devices still suffer from thermal conductivity both laterally between channels and vertically through the device.

SUMMARY

Accordingly, the present invention provides devices with thermoelectric and thermodiodic characteristics and methods for manufacturing such devices. The present invention provides greater efficiency of operation and highly accurate temperature control. Advantages of the present invention a highly efficient thermoelectric device that can also be used to transfer heat energy in one direction through the device and resist the heat energy passing back through the device.

Implementations of the present invention are wide ranging and can include, for example, improved methods and devices for cooling computer modules and other solid state technologies and reclamation of heat energy emanated from a combustion engine.

Other embodiments of the present invention can include a computerized system, executable software, or a data signal for controlling fabrication equipment and implementing the inventive methods of the present invention.

Various features and embodiments are further described in the following figures, drawings and claims.

DETAILED DESCRIPTION

Overview

The present invention provides devices with at least one of thermoelectric and thermodiodic characteristics. As referred to herein, a thermoelectric device include a device capable of controllably transferring heat energy from one portion of the device to another portion of the device and a thermodiodic device includes a device capable of controllably transferring heat in one direction from one portion of the device to another portion of the device and to resist the transfer of heat in an opposing direction.

According to the present invention, a device with thermoelectric and thermodiodic characteristics can be created by applying a current across a device with layers of dissimilar conductor or semiconductor material. In some embodiments of the present invention, the layers across which the current is applied can be as thin a monolayer. In addition, in some embodiments, an air gap across which a temperature differential is achieved can also be as thin as a monolayer.

Methods

Figure 1:
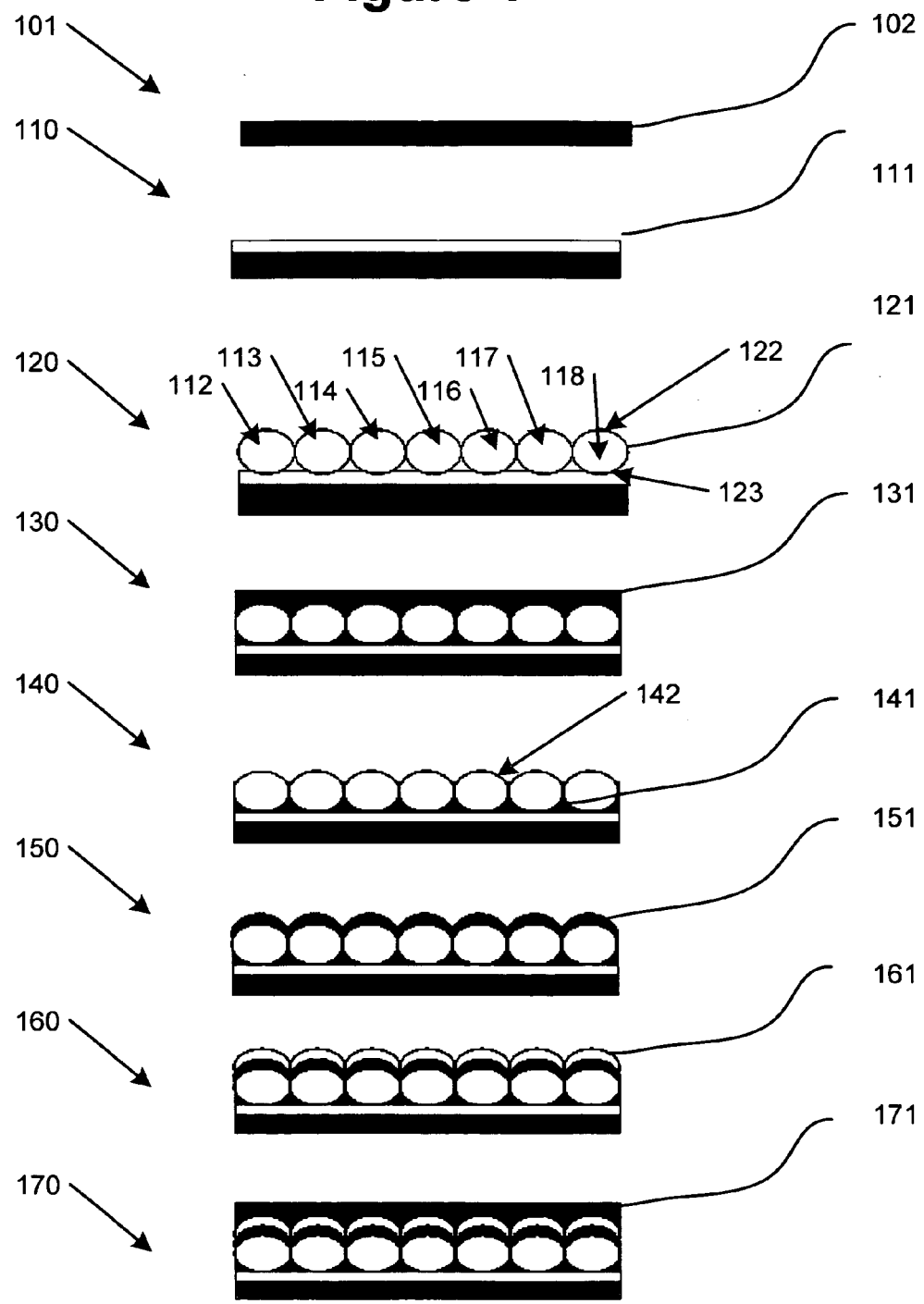
FIG. 1 illustrates a block diagram illustrates some embodiments of the present invention including method steps for forming a device with thermoelectric and/or thermodiodic characteristics and a cutaway view of a resulting device.

Referring now to FIG. 1, a block diagram illustrates some embodiments of the present invention including method steps for forming a device with thermoelectric and/or thermodiodic characteristics and a cutaway view of a resulting device. At 101, a conductive substrate 102 is made essentially flat to provide firmament to a device according to the present invention. At 110, in some embodiments, a solderable layer 111 can be applied to the substrate to facilitate adherence of subsequent layers. The solderable layer can include, for example, Au/Sn and gold.

At 120, a first conductive layer 121, such as, for example, Ag, is applied onto the conductive substrate 101 so that it is in electrical contact with the first conductive layer 121, such as, via the solder layer (if included). Although Ag may be a preferred embodiment; other embodiments can include, for example, any conductive species which can be reacted to form an ionic conductor. In addition, some embodiments can include a first conductive layer 121 of a micro sized material and some embodiments can also include a first conductive layer 121 of nano sized material.

The first conductive layer 121 includes a first surface 123 and a second surface 122, and, in some preferred embodiments, is made up of essentially a monolayer of multiple conductive material units 112-118. Preferred embodiments can also include units 112-118 that are ellipsoids which can be spherical or near spherical in shape. The first surface 123 can therefore be made up of a composite of a first portion of the multiple conductive units 112-118 and be in electrical contact with the conductive substrate 102. The first conductive layer can be applied by any known process, and in some embodiments, can be applied via spin casting processes.

Similarly, at 120, the second surface 122 of the first conductive layer 121 can include a composite of a second portion of the multiple conductive units 112-118.

In still other embodiments, the second surface of the first conductive layer 121 can be treated with a coating which lowers the work function of the first conductive layer. The coating can include, for example, at least one of: an alkali metal, an alkaline earth metal, and combinations thereof. Similarly, some embodiments can include depositing a sub layer (not illustrated) on top of said first conductive layer 121 and prior to the deposition of the non ionic conductor metallic film layer 161. The sub layer would be operative to lower the work function of the non ionic conductor metallic film layer.

At 130, an insulator material 131 is applied into contact with the second surface 122 of the first conductive layer. In various embodiments, the insulator material 131 can flow in between and below some portions of the first conductive layer 121, however it should not break the electrical contact between the first surface 123 and the electrical contact with the conductive substrate 102. For example, in some embodiments, the first conductive layer 121 can additionally include interstitial spaces. In such embodiments, the insulator layer 131 can be concurrently applied into said multiple interstitial spaces.

At 140, portions of the insulator 131 can be removed to expose one or more portions of the second surface of the first conductive layer 121. The insulator 131 can be removed through any known process, such as, for example, by etching.

At 150, the exposed areas of the second surface 122 are chemically treated to form a layer of ionic conductor 151. For example, a first conductive layer of Ag can receive a chemical treatment to form an ionic conductor. In some exemplary embodiments, using known methods in the arts, the Ag can be reacted with a sulfur containing reactant to form a layer of $Ag_2S$. Some exemplary embodiments can also include the step of reacting a silver sphere 112-118 with a sulfur reactant such that the thickness of resulting $Ag_2S$ is within the range of 80 Angstroms to 120 Angstroms.

At 160, a second conductive layer 161 is applied on top of the layer of ionic conductor 151. The second conductive layer can include, for example a thin layer of Ag. The second conductive layer can also be in contact with the insulator layer 141. In some preferred embodiments, the second conductive layer 161 can be the same material as the first conductive material 121. At 170, a top conductive layer 171 can be applied. In some preferred embodiments, the top layer 170 includes Ag and in other preferred embodiments, the preferred coating includes Au.

In some embodiments, the step of applying a second conductive layer 161 into contact with the layer comprising an ionic conductor 151 forms a metal film on top of the ionic conductor, (not illustrated) and the metal film is between 80 Angstroms and 120 Angstroms thick.

Various alternate embodiments can also include methods wherein the first conductor layer comprises a micro or nano sized unit of essentially spherical shape and the units are treated with a coating that lowers the work function of the unit. The coating can include, for example: at least one of: an alkali metal, an alkaline earth metal, and combinations thereof.

Figure 2:
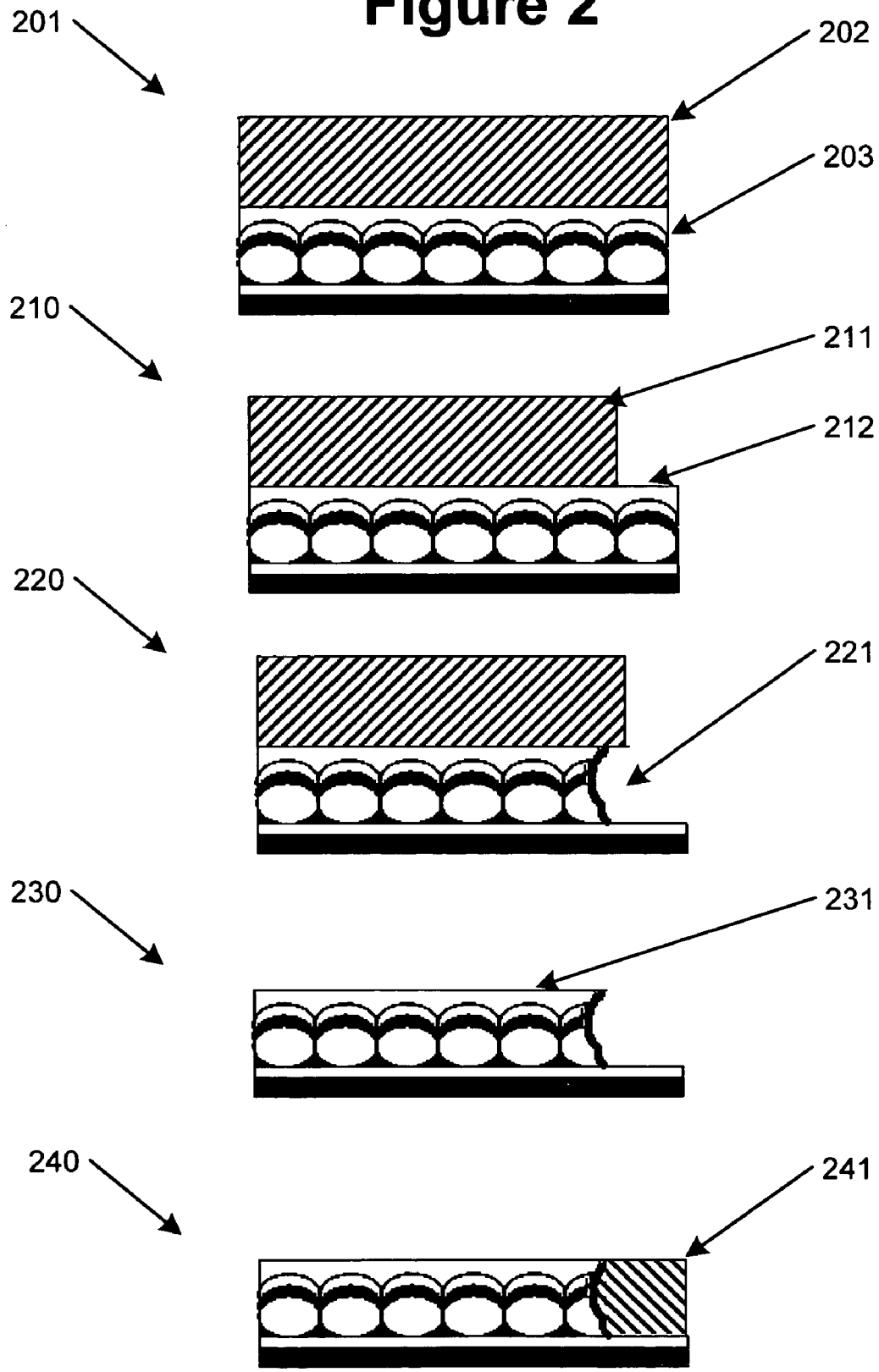
FIG. 2 illustrates a block diagram and method steps for forming a discrete device according to the present invention.

Referring now to FIG. 2, the present invention can additionally include formation of discrete devices. The devices can be formed, for example, via photo masking and etching processes.

At 201 a photo mask 202 can be applied on top of the accumulated processed layers 203. At 210, after the photo mask has been processed, etching can remove imaged areas not protected by the mask 212 to fashion a discrete device, or a series of discrete devices from the processed layers. For example, at 220 the second conductive layer 161, any ionic conductor 151, and the first conductive layer 121, can be removed in imaged areas to form a periphery of an active device region 231. In addition, if a top third conductive layer 171 has been applied, it can also be removed in the imaged areas.

At 230 the mask is removed using known methods in the art, such as, for example via etching, which again exposes the top coating 171.

At 240, an insulator layer is applied to create a passivation layer around the periphery of an active device region. In addition, the conductive substrate 102 can be cut in an area around beyond the passivation layer to create a discrete device from the individual active regions. The substrate 102 can be cut by any known method, such as for example, a water saw or diamond blade.

In some embodiments, the present invention can include the additional steps of exposing a device formed by the preceding steps to an electrical field sufficient to cause the ionic conductor layer to begin conducting. In some embodiments, the exposure continues until the second conductive layer 161 has been ionically conducted away from contacting the first conductive layer 121 or the ionic conductor layer upon said first conductive layer 151. In additional embodiments, the electrical field processing is repeated at least once during the operant lifetime of the device.

The device formed by the preceding steps can also be exposed to an electrical field sufficient to cause the ionic conductor layer to begin conducting and the exposure can continue until the first conductive layer has been ionically conducted away from contacting the second layer 161 or the ionic conductor layer upon the second conductive layer 151. This process can also be repeated at least once during the operant lifetime of the device thus formed.

Figure 3:
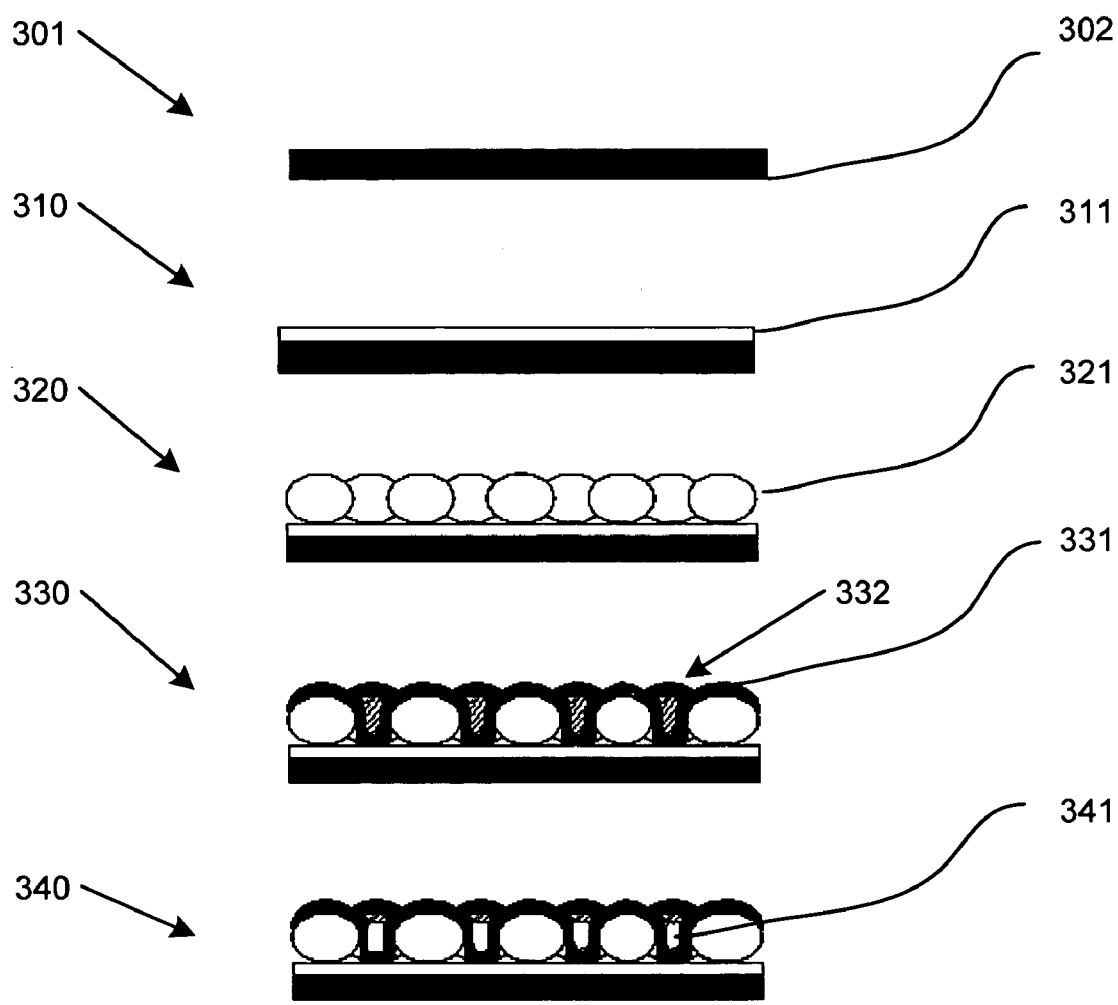
FIG. 3 illustrates include a block diagram and method steps for forming a substrate and solder coating on the substrate.
Figure 4:
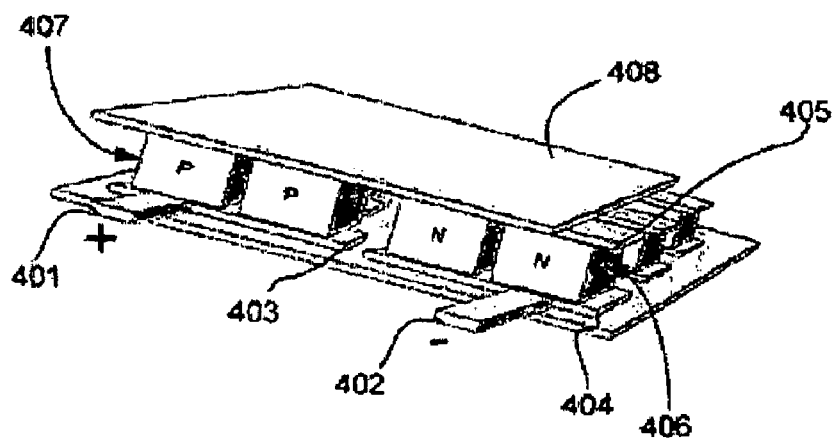
FIG. 4 illustrates prior art related to the present invention.

Referring now to FIG. 3, at 301 some embodiments can also include a substrate 302 and at 310 optionally coating the substrate 302 with a solder layer 311. At 320 the substrate can have a layer of spheres 321 or other shaped units applied. The spheres can comprise a conductive or semi conductive material, such as for example, Ag or Au, or a nonconductive material, such as, for example latex. At 330, the units 321 can be coated with a conductive coating, such as, for example Ag or Au 331 to form a first conductive layer 332. At 340, an insulator 341 can be applied to encapsulating the units 321 of the first conductive layer 121.

Having the first conductive layer 332 formed, any of the above processes maybe applied to create a thermoelectric or thermodiodic device. Other similar processes can also be implemented, such as, for example etching the first conductive layer 332 after the insulator layer 341 has been formed, such that the etching opens gaps between the edge of the first conductor layer units 321 and the encapsulating insulator layer 341. In some embodiments, the gap can be of sufficient size to allow material comprising a second conductive layer to flow into the gap, while not being large enough to completely free a shape from the first conductive layer from contact with the insulator layer.

Devices

In general, the methods of the present invention may be implemented with industrial deposition machinery to create discrete devices. The invention therefore includes any device fashioned according to the processes above. For example, embodiments of the present invention include a device including a substrate layer with a first conductive layer of units and an insulator between at least some of the micro sized units. The first conductive layer is in electrical contact with the substrate layer. The first conductive layer is also in electrical contact with a layer of ionic conductor which in turn is in contact with a second conductive layer.

According to some embodiments, the first conductive layer includes micro sized units, such as sphere shaped units, the units having a nano sized ionic layer in between the first conductive layer and the second conductive layer. Embodiments can also include a first conductor layer that includes units of between 800 angstroms and 2000 angstroms and the ionic conductor layer is between 80 and 120 angstroms. Other embodiments can include a first conductive layer that includes a non-metallic material, such as, for example, latex, coated with a conductive coating, such as, for example, silver.

CONCLUSION

A number of embodiments of the present invention have been described. Nevertheless, it will be understood that various modifications may be made without departing from the spirit and scope of the invention. For example, various methods or equipment may be used to implement the steps described herein. In addition, various casings and packaging can also be included in order to better adapt a thermoelectric or thermodiodic device according to a specific application.

For example, in some embodiments, the present invention can address the reduction of thermal conductivity thereby improving thermoelectric efficiency. Increased thermoelectric efficiency can be used for multiple applications, such as, for example, generating electricity from the waste heat of automobile engines and utilizing the electricity generated to charge an associated automobile battery or power vehicle accessories. In some embodiments, the electricity generated may be sufficient to facilitate elimination of the alternator. In some vehicles, elimination of the alternator can result in a 20% increase in vehicle fuel efficiency.

Other exemplary applications of devices formed according to the present invention can include: improving the cooling of computer chips by building the efficient thermoelectric device directly into the chip package; improving the efficiency and reducing the size of recirculating liquid chilling units used to cool large computers and servers; improving the efficiency and noise from air conditioning units; and improving the efficiency and noise from refrigerators;

Accordingly, other embodiments are within the scope of the following claims.

What is claimed is:

1. A method for forming a device, the method comprising:
   applying a first conductive layer onto a conductive substrate, said first conductive layer comprising essentially a monolayer of multiple conductive material units and having a first surface and a second surface, wherein said first surface comprises a composite of a first portion of the multiple conductive units is in electrical contact with said conductive substrate and the second surface comprises a composite of a second portion of the multiple conductive units;
   applying an insulator material into contact with said second surface of said first conductive layer;
   etching back the insulator material to a depth exposing at least a portion of the second surface comprising a composite of second portions of the multiple conductive units;
   chemically treating at least part of the exposed portion of the second surface comprising a composite of a second portion of the multiple conductive units, to form a layer comprising an ionic conductor across treated surface portions; and
   applying a second conductive layer into contact with the layer comprising an ionic conductor.

2. The method of claim 1 wherein each of the first conductive layer and the second conductive layer is relative thickness effective to form a device comprising thermoelectric characteristics.

3. The method of claim 1 wherein each of the first conductive layer and the second conductive layer is of relative thickness effective to form a device comprising thermodiodic characteristics.

4. The method of claim 1 wherein said first conductive layer comprises Ag.

5. The method of claim 1 wherein said first conductive layer comprises a conductive species and the method additionally comprises the step of reacting the first conductive layer to form an ionic conductor.

6. The method of claim 1, wherein the first conductive layer comprises a material including micro sized, essentially spherical shapes.

7. The method of claim 1, wherein the first conductive layer comprises a material including nano sized, essentially spherical shapes.

8. The method of claim 1 wherein said first conductive layer additionally forms interstitial spaces and the insulator layer is concurrently applied into said multiple interstitial spaces during the step of applying the insulator material.

9. The method of claim 1, wherein the multiple conductive material units comprising the first conductive layer comprises nano sized, essentially spherical shaped units, and the method additionally comprises the step of: treating the essentially spherical shaped units with a coating which lowers the work function of the essentially spherical shaped units.

10. The method of claim 1, additionally comprising the steps of:
    depositing a sub layer on top of said first conductive layer;
    depositing a non ionic conductor metallic film layer;
        wherein said sub layer lowers the work function of the non ionic conductor metallic film layer.

11. The method of claim 1, additionally comprising the steps of:
    applying a photo mask above the second conductive layer;
    etching through the top conductive layer and the layer comprising an ionic conductor and the first conductive layer; in imaged areas based upon the photomask to form a periphery of an active device region;
    applying an insulator layer creating a passivation layer around the periphery of an active device region; and
    cutting the conductive substrate in an area beyond the passivation layer to create a discrete device.

12. The method of claim 1 additionally comprising the step of applying a third conductive layer on top of the second conductive layer.

13. The method of claim 12 wherein the first conductive layer and the second conductive layer comprise silver and the third conductive layer comprises gold.

14. The method of claim 1, wherein the multiple conductive material units comprising first conductive layer comprises micro sized, essentially spherical shaped units, and the method additionally comprises the step of: treating the essentially spherical shaped units with a coating which lowers the work function of the essentially spherical shaped units.

15. The method of claim 14 wherein the coating comprises at least one of: an alkali metal, an alkaline earth metal, and combinations thereof.

16. The method of claims 15, wherein the insulator encapsulates the conductive material units and the method additionally comprises the steps of: etching the first conductive layer after the insulator layer has been formed, wherein said etching opens gaps between the edge of the conductive material units and the encapsulating insulator layer.

17. The method of claim 1 wherein the first conductive layer comprises Ag and the chemical treatment to form an ionic conductor comprises reacting at least a portion of the second surface with a sulfur containing reactant to form a layer of $Ag_2S$ and wherein the step of reacting the silver sphere with a sulfur reactant is carried out such that the thickness of the $Ag_2S$ is within the range of 80 Angstroms to 120 Angstroms.

18. The method of claim 17, additionally comprising the steps of: treating the second surface of the first conductive layer with a coating which lowers the work function of the first conductive layer.

19. The method of claim 1, additionally comprising the steps of:
    exposing a device formed by the preceding steps to an electrical field sufficient to cause the ionic conductor layer to begin conducting.

20. The method of claim 19, wherein the electrical field processing is repeated at least once during the operant lifetime of the device thus formed.

* * * * *